(12) United States Patent
Pang

(10) Patent No.: US 7,723,780 B2
(45) Date of Patent: May 25, 2010

(54) LATERAL DMOS DEVICE STRUCTURE AND MANUFACTURING METHOD THEREOF

(75) Inventor: Sung-Man Pang, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/122,964

(22) Filed: May 19, 2008

(65) Prior Publication Data

US 2008/0283908 A1    Nov. 20, 2008

(30) Foreign Application Priority Data

May 18, 2007    (KR) ...................... 10-2007-0048556

(51) Int. Cl.
*H01L 29/94*    (2006.01)
(52) U.S. Cl. .............................. 257/328; 257/E29.256; 257/E29.027; 257/E29.066; 257/E29.261; 257/335
(58) Field of Classification Search ................. 257/328, 257/335, E29.256, E29.027, E29.066
See application file for complete search history.

(56) References Cited

U.S. PATENT DOCUMENTS

2006/0071269 A1 *   4/2006   Hebert ....................... 257/335

FOREIGN PATENT DOCUMENTS

KR    10-1999-0037016    5/1999
KR    10-2006-0067582    6/2006

* cited by examiner

*Primary Examiner*—Matthew C Landau
*Assistant Examiner*—Yu-Hsi Sun
(74) *Attorney, Agent, or Firm*—Sherr & Vaughn, PLLC

(57) ABSTRACT

A lateral DMOS device includes a body diode region and a protective diode region. The body diode region has a second conduction type well region formed in a first conduction type semiconductor substrate, the second conduction type well region including a first conduction type body region and a drain region each formed in the second conduction type well region, a first conduction type impurity region and a source region formed in the first conduction type body region, and a gate insulating film and a gate electrode formed on the first conduction type semiconductor substrate. The first conduction type body region and the second conduction type well region compose a body diode. In the protective diode region, the first conduction type impurity region is formed at a prescribed interval and the first conduction type body region and the second conduction type well region compose a protective diode.

12 Claims, 6 Drawing Sheets

LATERAL DMOS DEVICE STRUCTURE AND MANUFACTURING METHOD THEREOF

The present application claims priority under 35 U.S.C. §119 to Korean Patent Application No. 10-2007-0048556 (filed May 18, 2007), which is hereby incorporated by reference in its entirety.

BACKGROUND

A power MOS field effect transistor (MOSFET) may have higher input impedance than a bipolar transistor. Accordingly, the power MOSFET may have a high power gain and a simple gate driving circuit. In addition, since the power MOSFET is a unipolar device, when the device is turned off, there is no time delay due to minority carrier accumulation or recombination. Such a power MOSFET may be applied to a switching mode power supply, a lamp stabilization system, and a motor driving circuit. Usually, a semiconductor device having a DMOS structure using planar diffusion technology is widely used.

Figure 1:
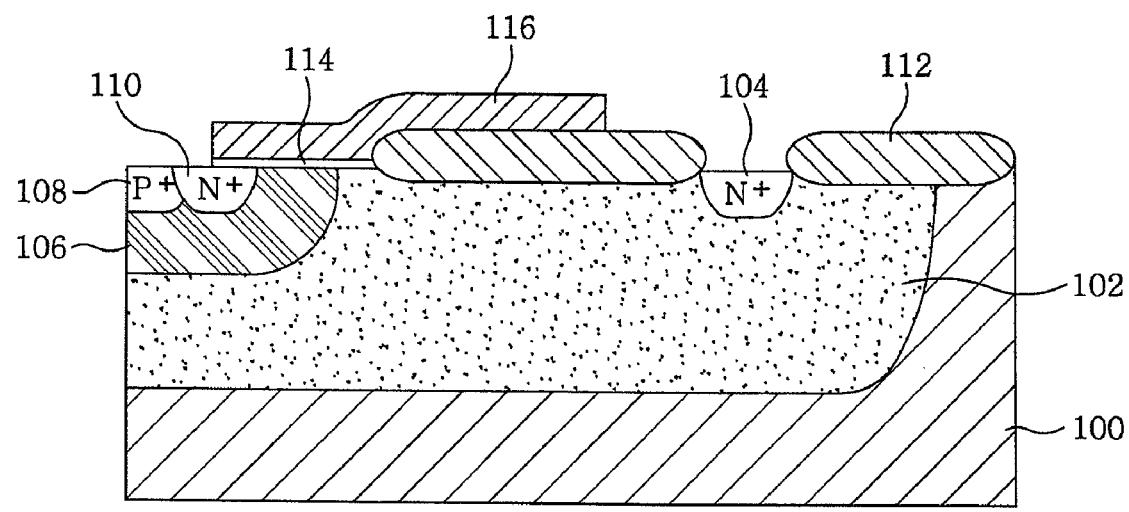

Example FIG. 1 illustrates a lateral DMOS device that may include N-well 102 at a single concentration formed on and/or over P-type semiconductor substrate 100, and drain region 104 formed within N-well 102 into which an N-type impurity may be injected at a high concentration. In addition, P-type body region 106 may be formed to have a predetermined distance spaced from the drain region. P+ impurity region 108 and N+ source region 110 may be formed within P-type body region 106. Field insulating film 112 for device separation may be formed on and/or over the surface of semiconductor substrate 100, and gate insulating film 114 and gate electrode 116 may also be formed in a predetermined region on and/or over field insulating film 112. P-type body region 106 and N-well 102 may compose a body diode.

The lateral DMOS device should endure a high drain-source voltage when turned off, while it should enable a lot of current flow between the drain and the source at high speed when turned on. The high drain-source voltage may cause a breakdown in the gate insulating film or at the junction of the body region and the source region. In addition, when a high voltage is continuously applied to the gate insulating film, stress is concentrated on the gate insulating film, which causes breakdown of the gate insulating film. In order to improve the breakdown voltage property of the gate insulating film, the gate insulating film may be relatively thickened. In this case, however, a threshold voltage is increased, which may deteriorate the operation characteristics of the device.

Figure 2:
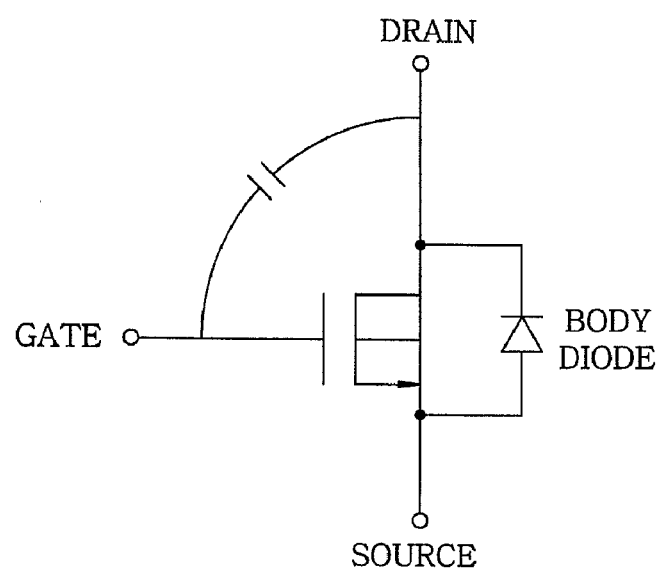
Figure 3:
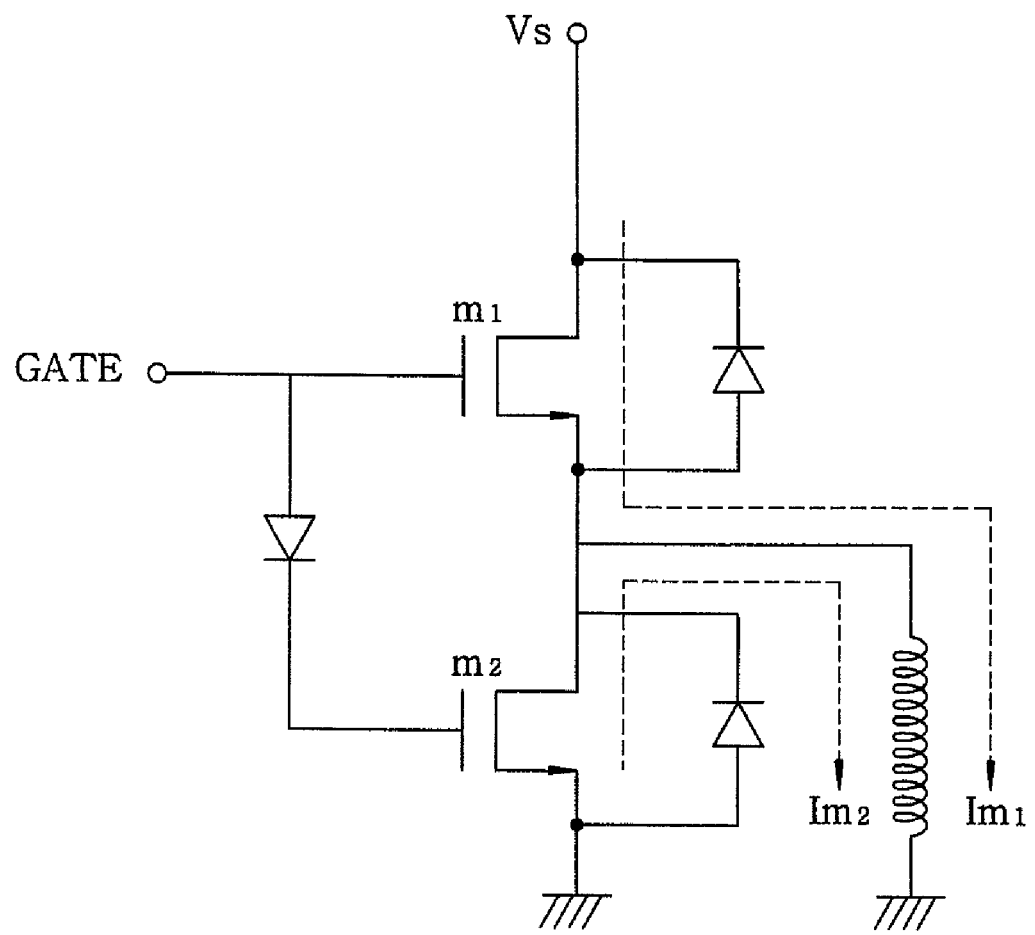

As illustrated in example FIGS. 2 and 3, when an inductor load is driven in a push-pull or bridge structure having DMOS devices m1 and m2, backward conduction $I_{m1}$, and forward conduction $I_{m2}$ may occur in the body diode. If large current flows through the body diode, minority carrier accumulation, diode-off delay, and parasitic bipolar junction transistor operation may occur.

SUMMARY

Embodiments relate to a lateral DMOS (Double Diffused MOSFET) device, and in particular, to a lateral DMOS device structure and a manufacturing method thereof suitable for manufacturing a lateral DMOS device for power or high voltage.

Embodiments relate to a lateral DMOS device structure and a manufacturing method thereof that forms a protective diode by forming a P+ impurity region at a prescribed interval in a lateral DMOS device, while not forming a source region.

Embodiments relate to a lateral DMOS device structure and a manufacturing method thereof that forms a protective diode in a lateral DMOS device to prevent the device from being broken due to high voltage, and increasing the operation speed of the device.

Embodiments relate to a method of manufacturing a lateral DMOS device having a body diode and can include at least one of the following steps: forming a second conduction type well on and/or over a first conduction type semiconductor substrate; and then forming a drain region and a first conduction type body region within the second conduction type well; and then forming a first conduction type impurity region in the first conduction type body region; and then forming a source region near the first conduction type impurity region in a prescribed region excluding a region where a protective diode is to be formed; and then forming a field insulating film in a device separation region of the semiconductor substrate in which the source region is formed; and then forming a gate insulating film and a gate electrode in a gate forming region of the semiconductor substrate on and/or over which the field insulating film is formed.

Embodiments relate to a lateral DMOS device that can include at least one of the following: a body diode region in which a second conduction type well region including a first conduction type body region and a drain region is formed, the first conduction type body region and the second conduction type well region constituting a body diode, and the first conduction type body region having a first conduction type impurity region and a source region on and/or over the surface of a first conduction type semiconductor substrate on and/or over which a gate insulating film and a gate electrode are formed; and a protective diode region in which the first conduction type impurity region is formed at a prescribed interval, the first conduction type body region and the second conduction type well region constituting a protective diode.

DRAWINGS

Example FIG. 1 illustrates a lateral DMOS device.

Example FIG. 2 illustrates an equivalent circuit of an N-type DMOS device.

Example FIG. 3 illustrates a push-pull current control circuit using a power DMOS device.

Figure 4:
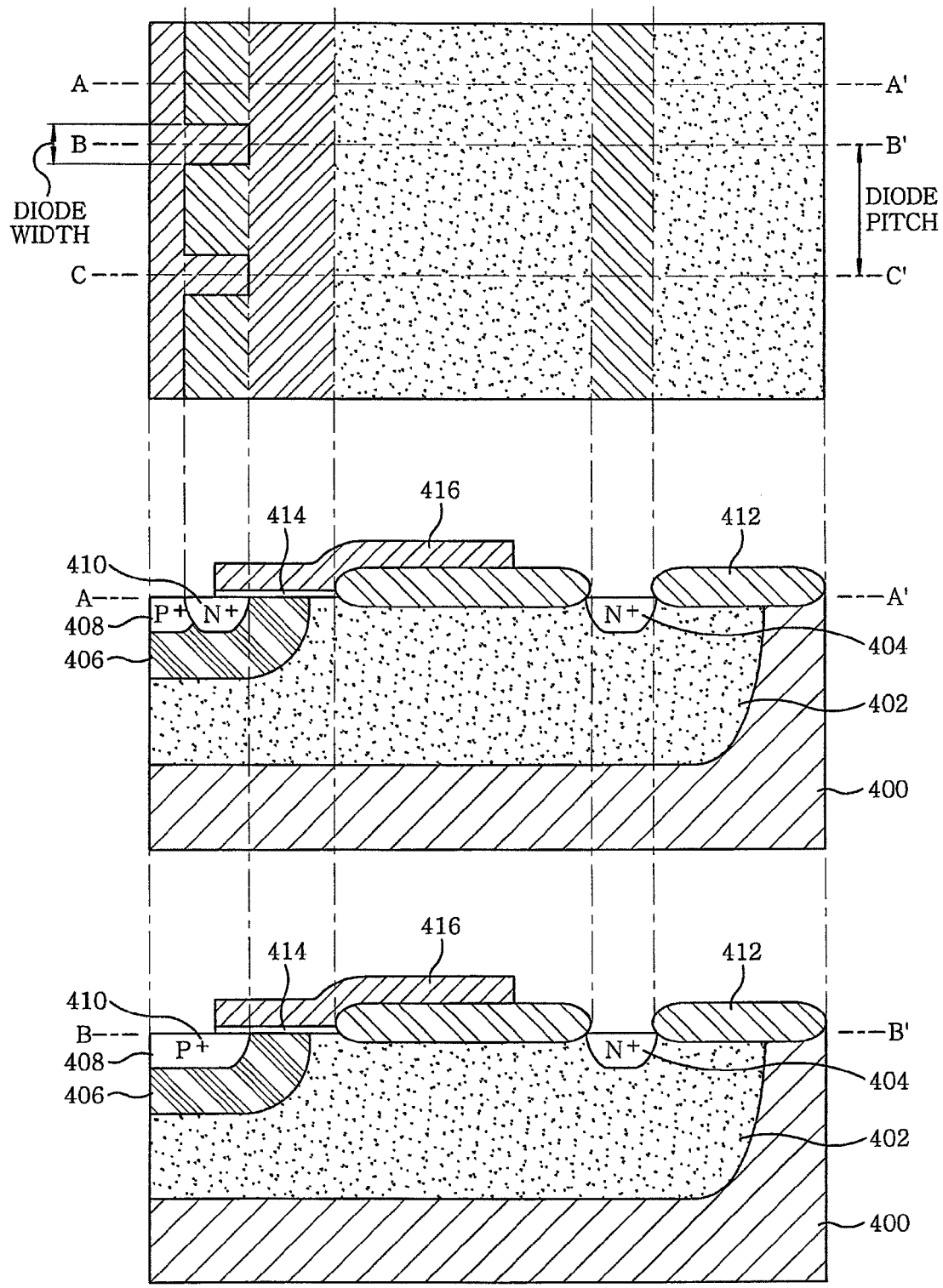

Example FIG. 4 illustrates a lateral DMOS device having a protective diode, in accordance with embodiments.

Figure 5:
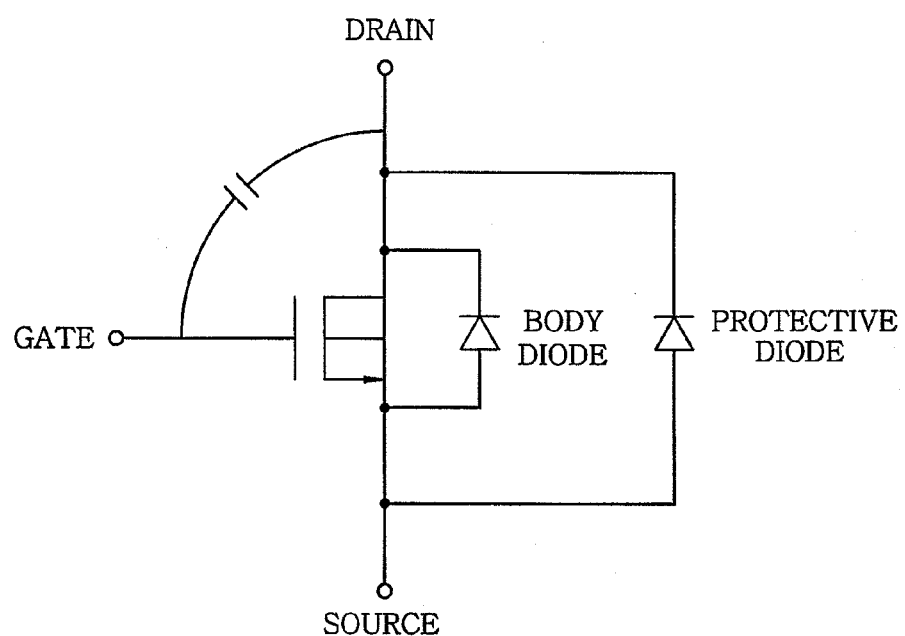

Example FIG. 5 illustrates an equivalent circuit of a lateral DMOS device having a protective diode, in accordance with embodiments.

Example FIGS. 6A to 6E illustrate a process for manufacturing a lateral DMOS device having a protective diode, in accordance with embodiments.

DESCRIPTION

In accordance with embodiments, with respect to a region excluding a region where a protective diode is to be formed, a first conduction type impurity region and a second conduction type source region can be formed in a P-type body region. With respect to the region where the protective diode is to be formed, a first conduction type impurity region is only formed. In this way, with respect to the region excluding the region where the protective diode is to be formed, a first conduction type body region and a second conduction type well compose a body diode, and with respect to the region where the protective diode is to be formed, the first conduction type body region and the second conduction type well compose a protective diode.

As illustrated in example FIG. 4, provided herein is a structure for a lateral DMOS device having a protective diode in accordance with embodiments. Hereinafter, a case in which a first conduction type is P-type and the second conduction type is N-type will be described, but the first conduction type may be N-type and the second conduction type may be P-type.

As illustrated in example FIG. 4, second conduction type well 402 at a single concentration, for example, an N-well, can be formed on and/or over first conduction type semiconductor substrate 400, for example, a P-type semiconductor substrate. Drain region 404 into which a second conduction type (N+) impurity is injected at a high concentration can be formed in second conduction type well 402. First conduction type (P-type) body region 406 can be formed in second conduction type well 402 in a region spaced by a predetermined distance from drain region 404.

With respect to a region (A-A' region) excluding a region where a protective diode is to be formed, first conduction type (P+) impurity region 408 and second conduction type (N+) source region 410 are formed in first conduction type body region 406. With respects to region B-B' and region C-C' where the protective diode is to be formed at a prescribed interval according to the characteristics of the application circuit and device, while second conduction type source region 410 is not formed, first conduction type impurity region 408 is formed on and/or over a region corresponding to second conduction type source region 410. Field insulating film 412 for device separation can then be formed on and/or over the surface of semiconductor substrate 400. Gate insulating film 414 and gate electrode 416 can then be formed in a predetermined region on field insulating film 412.

The prescribed interval according to the characteristics of the application circuit and the device can be determined according to a diode pitch and a diode width. The diode pitch corresponds to the source region in the DMOS device. Accordingly, the total area of the DMOS device can be represented by the sum of the area over the diode width and the area over the diode pitch. A ratio of the area over the diode width to the total area can be, for example, 1:2. For example, when the length of the DMOS device is 100 μm and the ratio of the area over the diode width is 1:2, a DMOS device may be formed by repetitively arranging (five times) a diode width of 10 μm and a diode pitch of 10 μm. Of course, a DMOS device can be formed with a diode width of 50 μm and a diode pitch of 50 μm, a diode width of 15 μm and a diode pitch 15 μm, or a diode width of 10 μm and a diode pitch of 20 μm.

First conduction type body region 406 and second conduction type well 402 can compose a body diode in the region (i.e., A-A' region) excluding the region where the protective diode is to be formed. Further, first conduction type body region 406 and second conduction type well 402 can compose a protective diode (protective matching diode) in the region (i.e., B-B' region and C-C' region) where the protective diode is to be formed. Here, an equivalent circuit of a lateral DMOS device having a protective diode can be illustrated by an equivalent circuit of the body diode and the protective diode, as illustrated in example FIG. 5.

Example FIGS. 6A to 6E illustrate a process for manufacturing a lateral DMOS device having a protective diode in accordance with embodiments.

Figure 6A:
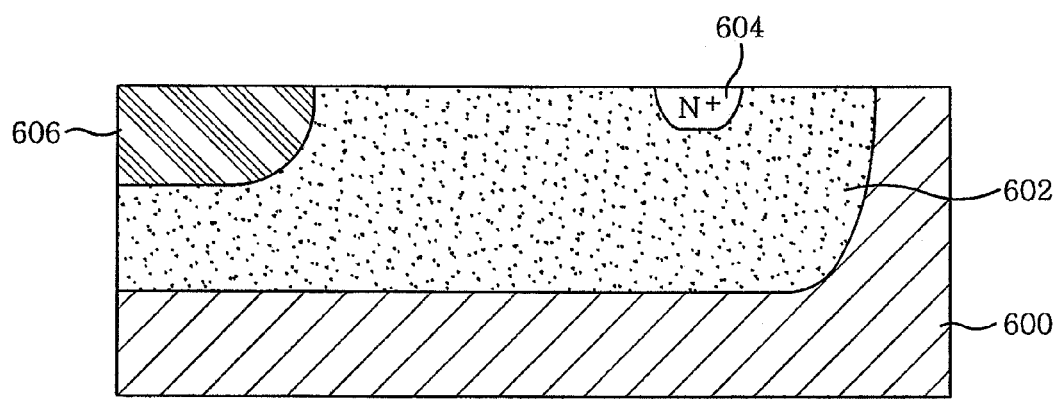

As illustrated in example FIG. 6A, second conduction type well 602 at a single concentration, for example, an N-well, can be formed on first conduction type semiconductor substrate 600, for example, a P-type semiconductor substrate. Drain region 604 into which a second conduction type (N+) impurity is injected at a high concentration can then be formed in second conduction type well 602. First conduction type (P-type) body region 606 is formed in second conductive type well 602 spaced apart by a predetermined distance from drain region 604. With respect to the region (i.e., A-A' region) excluding the region where the protective diode is to be formed, first conduction type body region 606 can be formed by ion-injecting boron (B) at a concentration of $1\times10^{13}$ to $4\times10^{14}$ ion/cm$^2$ with energy of 40 to 100 KeV. With respect to the region (i.e., A-A' region) where the protective diode is to be formed, first conduction type body region 606 can be formed by ion-injecting boron (B) at a concentration of $1\times10^{14}$ to $7\times10^{15}$ ion/cm$^2$ with energy of 60 to 100 KeV.

Figure 6B:
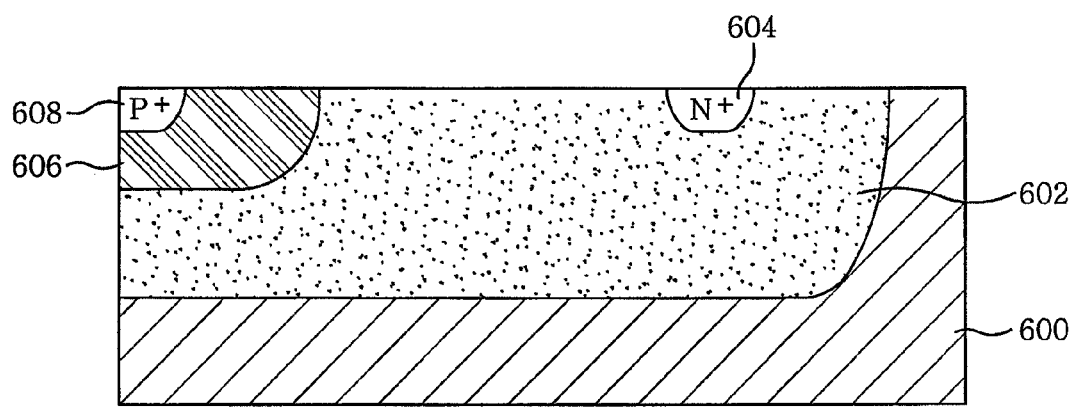

As illustrated in example FIG. 6B, first conduction type (P+) impurity region 608 for controlling a bias to be applied to the body region can then be formed in first conduction type body region 606.

Figure 6C:
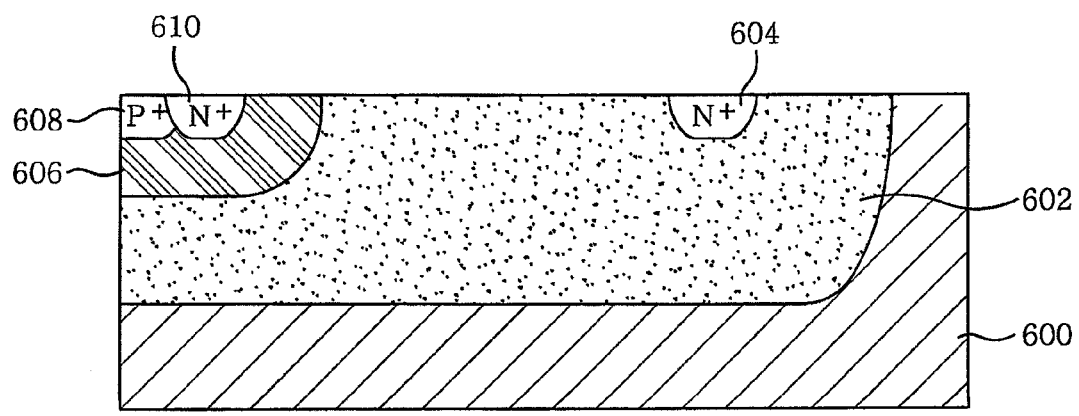

As illustrated in example FIG. 6C, with respect to the region (i.e., A-A' region) excluding the region where the protective diode is to be formed, source region 610 into which a second conduction type impurity is injected at a high concentration can then be formed adjacent first conduction type impurity region 608. Meaning, with respects to the region (i.e., A-A' region) excluding the region where the protective diode is to be formed, first conduction type impurity region 608 and second conduction type (N+) source region 610 can be formed according to the structure for a lateral DMOS device. Further, with respect to the region (i.e., B-B' region and C-C' region) where the protective diode is to be formed at a prescribed interval according to the characteristics of the application circuit and the device, while second conduction type source region 610 is not formed, first conduction type impurity region 608 can be formed on and/or over a region corresponding to second conduction type source region 610. Source region 610 can be formed by ion-injecting arsenic (As) at a concentration of $5\times10^{14}$ to $1\times10^{16}$ ion/cm$^2$ with energy of 20 to 100 KeV.

Figure 6D:
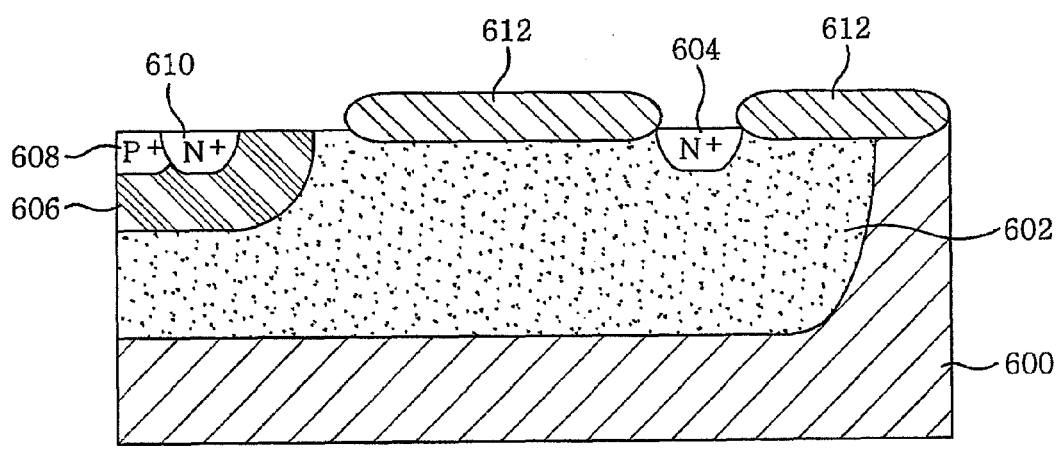

As illustrated in example FIG. 6D, after completion of the ion injection process along the region where the protective diode is to be formed, field insulating film 612 for device separation can then be formed on and/or over the surface of semiconductor substrate 600.

Figure 6E:
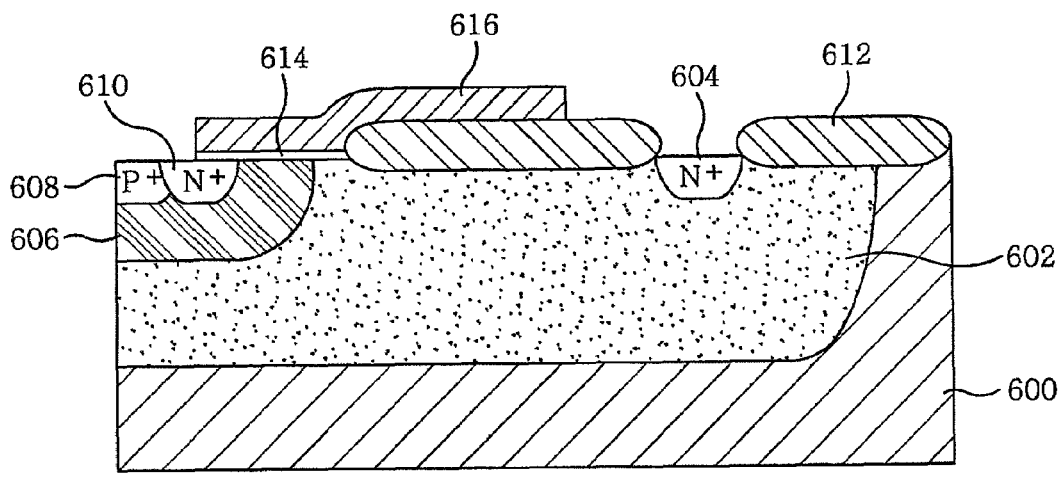

As illustrated in example FIG. 6E, gate insulating film 614 can be formed in a gate forming region on and/or over semiconductor substrate 600 including first conduction type body region 606 and second conduction type source region 610. Gate electrode 616 can also be formed in a gate forming region on and/or over gate insulating film 614 and field insulating film 612.

Subsequently, an interlayer insulating film, a drain electrode, and a source electrode can also be formed. The interlayer insulating film can be provided for insulation from other conductive layers. The drain electrode can be connected to drain region 604 through a contact hole formed in the interlayer insulating film. The source electrode can be connected to first conduction type impurity region 608 and second conduction type source region 610. In this way, during the manufacturing process of the lateral DMOS device, the first conduction type impurity region is formed at the prescribed interval, while the second conduction type source region is not formed, thereby forming the protective diode. Therefore, it is possible to manufacture a lateral DMOS device which is capable of preventing breakdown from occurring.

As described above, in accordance with embodiments, unlike a DMOS device where the first conduction type body region, in which the first conduction type impurity region and the source region are formed, and the second conduction type well region compose the body diode, with respect to the region excluding the region where the protective diode is to be formed, the first conduction type impurity region and the second conduction type source region are formed in the first conduction type body region, and with respect to the region where the protective diode is to be formed at the prescribed interval, the first conduction type impurity region is formed. Accordingly, with respects to the region excluding the region where the protective diode is to be formed, the first conduction type body region and the second conduction type well region compose the body diode. Furthermore, in the region where the protective diode is to be formed, the first conduction type body region and the second conduction type well region compose the protective diode. Therefore, a semiconductor device can be prevented from being broken, and breakdown voltage property can be improved. In addition, the operation speed of the device can be improved, and thus yield of the semiconductor device can be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a lateral DMOS device having a body diode, the method comprising:
    providing a first conduction type semiconductor substrate having a body diode region and a protective diode region;
    forming a second conduction type well in the body diode region and the protective diode region of the first conduction type semiconductor substrate, and forming a drain region and a first conduction type body region in the second conduction type well; and then
    forming a first conduction type impurity region in the first conduction type body region; and then
    forming a source region only in the body diode region adjacent to the first conduction type impurity region in a prescribed region; and then
    forming a field insulating film in a device separation region of the semiconductor substrate in which the source region is formed, the field insulating film overlapping the body diode region and the protective diode region; and then
    forming a gate insulating film and a gate electrode in a gate forming region of the semiconductor substrate on which the field insulating film is formed,
    wherein the first conduction type body region formed in the protective diode region is formed at a concentration level higher than a concentration level of the first conduction type body region of the body diode region.

2. The method of claim 1, wherein the first conduction type body region is formed by ion-injecting boron.

3. The method of claim 2, wherein, in the region excluding the region where the protective diode is to be formed, the first conduction type body region is formed by performing an ion injection process at a concentration of $1\times10^{13}$ to $4\times10^{14}$ ion/$cm^2$ with energy of 40 to 100 KeV.

4. The method of claim 2, wherein, in the region where the protective diode is to be formed, the first conduction type body region is formed by performing an ion injection process at a concentration of $1\times10^{14}$ to $7\times10^{15}$ ion/$cm^2$ with energy of 60 to 100 KeV.

5. The method of claim 1, wherein the source region is formed by ion-injecting arsenic.

6. The method of claim 5, wherein the source region is formed by performing an ion injection process at a concentration of $5\times10^{14}$ to $1\times10^{16}$ ion/$cm^2$ with energy of 20 to 100 KeV.

7. A lateral DMOS device comprising: a body diode region having a second conduction type well region formed in a first conduction type semiconductor substrate, the second conduction type well region including a first conduction type body region and a second conduction type drain region each formed in the second conduction type well region, a first conduction type impurity region formed in the first conduction type body region, a second conduction type source region formed in the first conduction type body region, and a gate insulating film and a gate electrode formed on the first conduction type semiconductor substrate, wherein the first conduction type body region and the second conduction type well region compose a body diode; and
    a protective diode region having the second conduction type well region formed in the first conduction type semiconductor substrate, the second conduction type well region including the first conduction type body region and the second conduction type drain region each formed in the second conduction type well region, and a first conduction type impurity region formed in the first conduction type body region, and a gate insulating film and a gate electrode formed on the first conduction type semiconductor substrate, wherein the first conduction type body region is formed at a prescribed interval at a concentration level higher than a concentration level of the first conduction type body region of the body diode region, wherein the first conduction type body region and the second conduction type well region compose a protective diode.

8. The device of claim 7, wherein the first conduction type body region is formed by implanting boron ions.

9. The device of claim 8, wherein, in the body diode region, the first conduction type body region is formed by an ion injection process at a concentration of $1\times10^{13}$ to $4\times10^{14}$ ion/$cm^2$ with energy of 40 to 100 KeV.

10. The device of claim 8, wherein, in the protective diode region, the first conduction type body region is formed by an ion injection process at a concentration of $1\times10^{14}$ to $7\times10^{15}$ ion/$cm^2$ with energy of 60 to 100 KeV.

11. The device of claim 7, wherein the source region is formed by implanting arsenic ions.

12. The device of claim 11, wherein the source region is formed by an ion injection process at a concentration of $5\times10^{14}$ to $1\times10^{16}$ ion/$cm^2$ with energy of 20 to 100 KeV.

* * * * *